United States Patent
Delgado et al.

(10) Patent No.: US 8,466,007 B2
(45) Date of Patent: Jun. 18, 2013

(54) POWER SEMICONDUCTOR MODULE AND FABRICATION METHOD

(75) Inventors: Eladio Clemente Delgado, Burnt Hills, NY (US); Richard Alfred Beaupre, Pittsfield, MA (US); Stephen Daley Arthur, Glenville, NY (US); Ernest Wayne Balch, Ballston Spa, NY (US); Kevin Matthew Durocher, Waterford, NY (US); Paul Alan McConnelee, Schenectady, NY (US); Raymond Albert Fillion, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 106 days.

(21) Appl. No.: 13/236,748

(22) Filed: Sep. 20, 2011

(65) Prior Publication Data

US 2012/0009733 A1    Jan. 12, 2012

Related U.S. Application Data

(62) Division of application No. 11/279,011, filed on Apr. 7, 2006, now Pat. No. 8,049,338.

(51) Int. Cl.
*H01L 21/50*    (2006.01)

(52) U.S. Cl.
USPC ............ 438/107; 438/669; 438/209; 257/770; 257/772; 257/775

(58) Field of Classification Search
USPC .................................... 257/770–775
See application file for complete search history.

(56) References Cited

U.S. PATENT DOCUMENTS

| | | | |
|---|---|---|---|
| 4,783,695 A | 11/1988 | Eichelberger et al. |
| 5,488,256 A | 1/1996 | Tsunoda |
| 5,527,741 A | 6/1996 | Cole et al. |
| 5,672,546 A | 9/1997 | Wojnarowski et al. |
| 6,377,461 B1 | 4/2002 | Ozmat et al. |
| 6,396,153 B2 | 5/2002 | Fillion et al. |
| 6,410,356 B1 | 6/2002 | Wojnarowski et al. |
| 7,327,024 B2 | 2/2008 | Stevanovic et al. |
| 2006/0118815 A1 | 6/2006 | Otremba et al. |
| 2007/0057284 A1 | 3/2007 | Casey et al. |

*Primary Examiner* — Mamadou Diallo
(74) *Attorney, Agent, or Firm* — Scott J. Asmus

(57) ABSTRACT

A power semiconductor module includes: an interconnect layer including an electrical conductor patterned on a dielectric layer, the electrical conductor including a power coupling portion having a thickness sufficient to carry power currents and a control coupling portion having a thickness thinner than that of the power coupling portion; and a semiconductor power device physically coupled to the interconnect layer and electrically coupled to the power coupling portion of the electrical conductor.

4 Claims, 13 Drawing Sheets

500

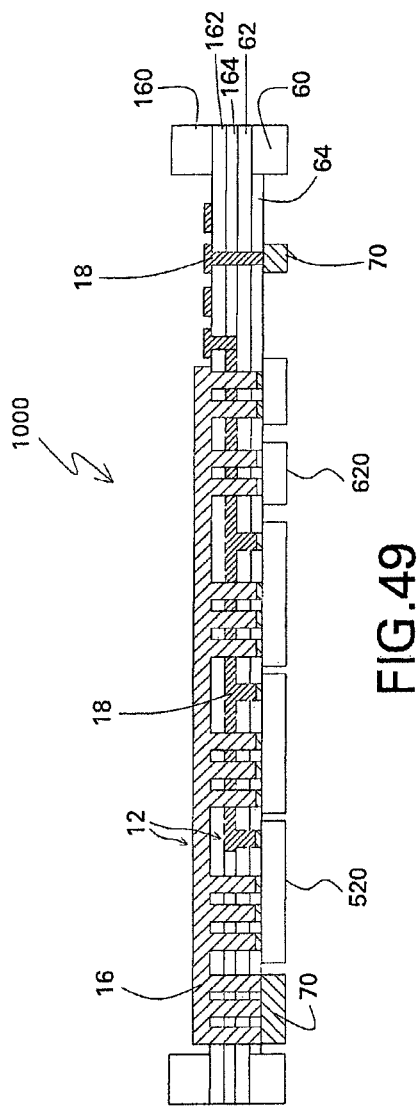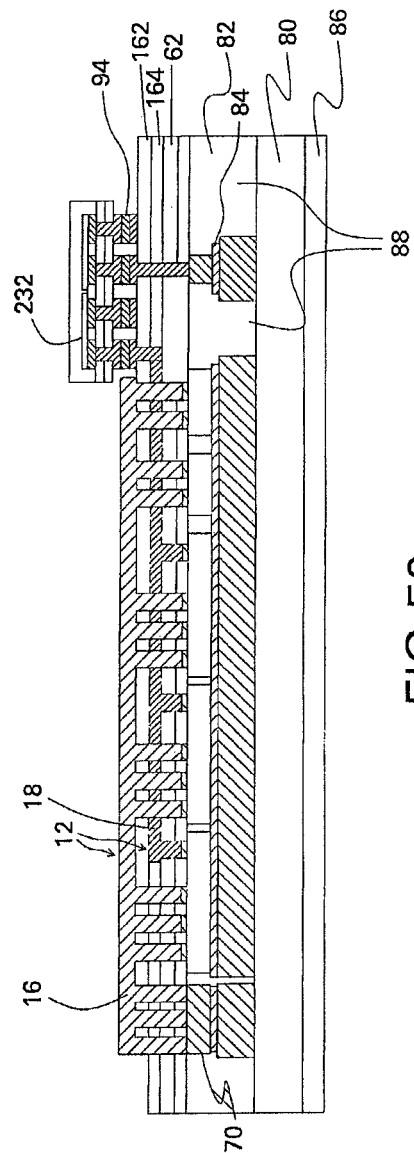

POWER SEMICONDUCTOR MODULE AND FABRICATION METHOD

CROSS-REFERENCE TO RELATED APPLICATIONS

This is a Divisional Application of U.S. application Ser. No. 11/279,011 filed on Apr. 7, 2006, now U.S. Pat. No. 8,049,338 which is incorporated in its entirety herein by reference.

BACKGROUND

The invention relates generally to power semiconductor modules.

When high current carrying power semiconductor modules (modules operating at or above 100 amperes, for example) must withstand high temperatures, such modules are often fabricated with silicon carbide (SiC) devices. SiC is useful for high temperature applications, but producing low defects per wafer in SiC is a challenge.

Semiconductor devices made on SiC wafers are often relatively small in order to obtain higher percentage yields of good working devices. For example, typical geometries for a SiC diode are approximately three millimeters by three millimeters by 0.359 millimeters, and typical geometries of an active device such as a SiC MOSFET range from 1.2 millimeters to 4 millimeters per side with gate geometries as small as 250 micrometers and source pads as small as 390 micrometers.

In many SiC power semiconductor modules, SiC devices are coupled in parallel to provide higher current carrying capability. These SiC devices are typically in the six ampere to twenty ampere range. Small gate and source or emitter contact pads have very fine geometry that can be difficult to interconnect when a large number of these devices are coupled in parallel.

BRIEF DESCRIPTION

Briefly, in accordance with one embodiment of the present invention, a power semiconductor module comprises: an interconnect layer comprising an electrical conductor patterned on a dielectric layer, the electrical conductor comprising a power coupling portion comprising a thickness sufficient to carry power currents and a control coupling portion comprising a thickness thinner than that of the power coupling portion; and a semiconductor power device physically coupled to the interconnect layer and electrically coupled to the power coupling portion of the electrical conductor.

DRAWINGS

These and other features, aspects, and advantages of the present invention will become better understood when the following detailed description is read with reference to the accompanying drawings in which like characters represent like parts throughout the drawings, wherein:

FIGS. 49 and 50 are sectional side views of a power semiconductor module in accordance with another embodiment.

DETAILED DESCRIPTION

Figure 1:
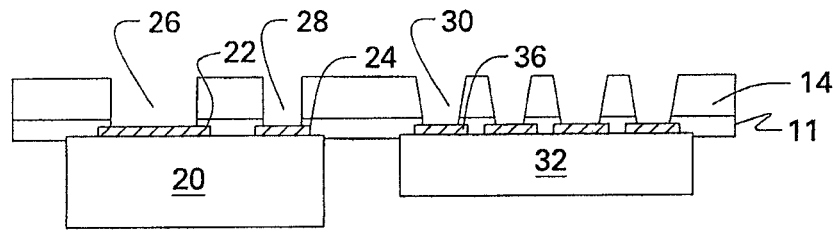
FIGS. 1-6 illustrate process stages in fabricating a power semiconductor module in accordance with one embodiment.

FIGS. 1-6 illustrate process stages in fabricating a power semiconductor module 100 which in one embodiment comprises an interconnect layer 10 (FIG. 6) comprising an electrical conductor 12 patterned on a dielectric layer 14. Electrical conductor 12 comprises a power coupling portion 16 comprising a thickness sufficient to carry power currents and a control coupling portion 18 comprising a thickness thinner than that of power coupling portion 16. A semiconductor power device 20 is physically coupled to interconnect layer 10 and electrically coupled to power coupling portion 16 of electrical conductor 12. As used herein, words such as "a" or "an" are intended to mean at least one.

FIG. 1 illustrates semiconductor power device 20 and a semiconductor control device 32 coupled to dielectric layer 14. In one embodiment power device 20 and semiconductor control device 32 are coupled with a non-conducting organic adhesive 11, such as a polymer adhesive for example, and without solder or conductive polymers.

Semiconductor power device 20 may comprise any power carrying device with several examples being transistors such as MOSFETs (metal oxide semiconductor field effect transistors) and IGBTs (insulated gate bipolar transistors) and other devices such as diodes and thyristors. Semiconductor power device 20 may comprise any suitable material with several examples including silicon, silicon carbide, and gallium nitride. In one embodiment, semiconductor power device 20 is capable of operating at a voltage of at least 40 volts and a current of at least 10 amperes. Typically semiconductor power device 20 will include a power pad 22 for coupling to power coupling portion 16 and a control pad 24 for coupling to control coupling portion 18 of electrical conductor 12.

Semiconductor control device 32 requires less current than semiconductor power device 20 and may comprise, for example, a sensing element, a processing element, a signal conditioning element, an electrical communication element, an optoelectrical communication element, or combinations thereof. Although power device 20 and control device 32 are situated on a common side of interconnect layer 10 (FIG. 6) for purposes of example, in another embodiment, a control device may be situated on an opposing side of the interconnect layer than the power device (such as illustrated in FIG. 50 for example).

Dielectric layer 14 may comprise any appropriate material including, for example, organic materials such as polymers (or more specifically polyimides), inorganic materials such as ceramics (with one more specific example being aluminum oxide ($Al_2O_3$)), nitrides (with one more specific example being aluminum nitride (AlN)), oxides (with one more specific example being beryllium oxide (BeO)), or carbides (with one example being SiC). Dielectric layer 14 may additionally include filler materials. For example, in some embodiments, it is useful to use filler materials to affect dielectric constants and coefficients of thermal expansion. In some embodiments, fillers are useful for controlling the glass transition temperature and potentially reducing the need for an adhesive. Polymers which are expected to be particularly useful with fillers are polytetrafluoroethylene and liquid crystal polymers. Fillers which are expected to be useful include, for example, silica and nano-clays. The selection of the material for dielectric layer 14, as well as all dielectric layers described herein, will depend upon the planned operating conditions for the specific module with higher temperature environment modules requiring more temperature resistant materials, for example.

Dielectric layer 14 may comprise vias 26, 28, 30 extending therethrough to chip pads 26, 28, 30 with electrical conductor 12 (FIG. 6) extending into at least some of the vias. Vias 26, 28, 30 may be fabricated either after or before attachment of power device 20 and control device 32. Any appropriate via hole fabrication technique may be used, with several examples including laser ablating, mechanical punching (most applicable for formation before attachment), and water jet pulsing.

Figure 2:
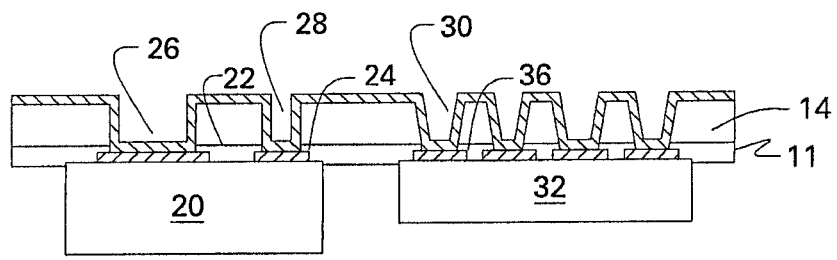

FIG. 2 illustrates the addition of a first layer 34 of electrical conductor 12 which is applied over dielectric layer 14, vias 26, 28, 30, and contact pads 22, 24, 36. Any suitable application technique may be used with one example being metallization of a seed layer such as titanium, chrome, nickel, or copper nickel by sputtering, evaporation, or electroless plating followed by electroplating or sputtering the surface with a metal such as copper, aluminum, or silver to a thickness of two microns to twenty microns, or, in a more specific embodiment, from two microns to ten microns.

Figure 3:
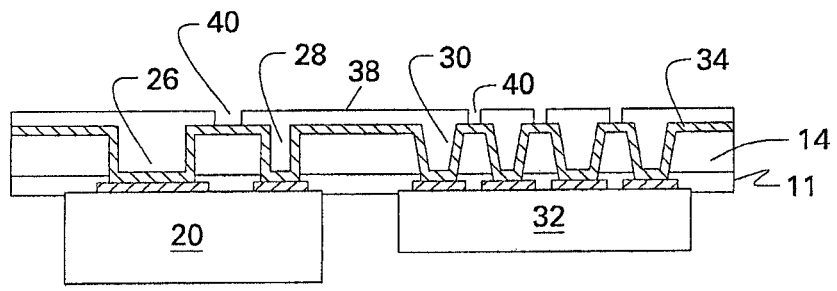
Figure 4:
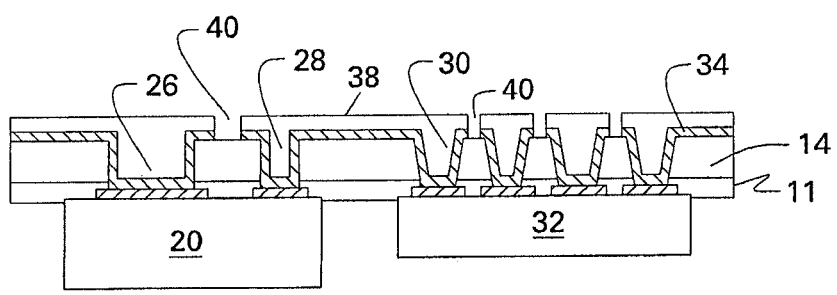

FIG. 3 illustrates a film photomask 38 applied to first layer 34 and photodefined to provide open areas 40 for electrical conductor etching, and FIG. 4 illustrates first layer 34 of electrical conductor 12 after patterning. In one example, photomask 38 comprises negative or positive acting photoresist. Photoresist application processes may include dry film, spray, spin, electrophoretic, or immersion processes, for example. Patterning of first layer 34 through photomask 38 may be accomplished by wet etching the exposed areas. After patterning, photomask 38 is removed.

Figure 5:
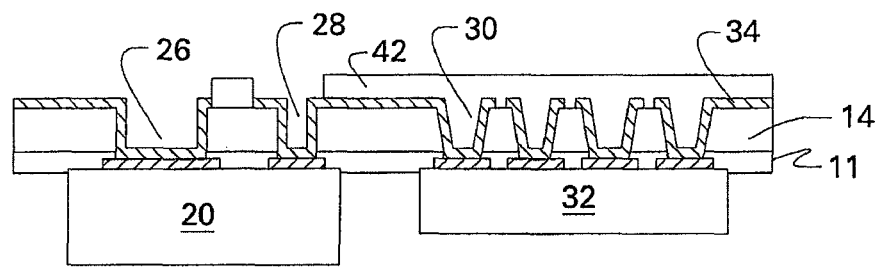

FIG. 5 illustrates an additional (or second) dielectric layer 42 which covers selected areas and leaves other areas open. Typically additional dielectric layer 42 comprises a photodefinable polymer such as a polyimide. Dielectric layer 42 may be applied by any appropriate technique with several examples being spin coating and film coating. For film coating embodiments, the dielectric layer may not extend completely into the vias. For spin coating embodiments, sequential build up of dielectric layer materials is useful to increase layer thicknesses.

Figure 6:
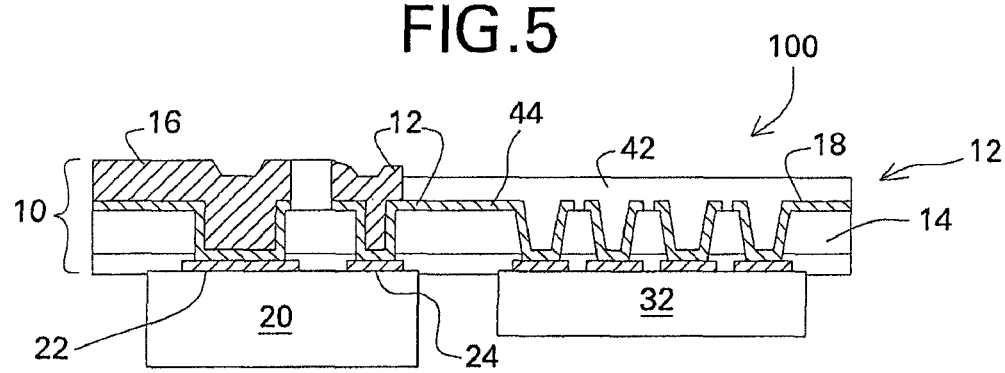

FIG. 6 illustrates power semiconductor module 100 after the exposed portion of first layer 34 has been electroplated up to a higher thickness to form power coupling portion 16 of electrical conductor 12. In one example copper is used as the electroplated material. As can be seen, semiconductor control device 32 is electrically coupled to control coupling portion 18 and semiconductor power device 20 is electrically coupled to power coupling portion 16 (and may additionally be coupled to control coupling portion 18 as shown by portion 44).

The thickness of power coupling portion 16 is selected to be sufficient for carrying power currents in the intended use for the module. In one example, the thickness is selected to be thick enough to maintain a current density such that it will not add significant power loss to the module or generate significant heat to the module (for example, will not result in losses in current density through copper of greater than about five percent or in a more specific embodiment will not result in losses in current density through copper of greater than about two percent). In one embodiment, the thickness is greater than or equal to ten microns. Although there is no upper bound on the thickness, in another embodiment the thickness is in the range of 25 microns to 200 microns or more specifically 25 microns to 150 microns.

This embodiment is useful because the thickness that is generally needed for power carrying capacity is typically too thick for integration of control signals because of the finer resolution due to interconnecting pad sizes which are typically found on control devices. The semiconductor power modules described herein may be embodied in any appropriate application with several examples being intelligent power modules for motor control, DC-DC converters, starter generators and other applications requiring high density power electronics.

The embodiments described above (as well as the embodiments described below) may be used in any desired combination with one example fabrication method comprising: providing a first dielectric layer 14, a power semiconductor device 20, and a control device 32 with power semiconductor device 20 and control device 32 having contact pads 22, 24, 36 aligned with via openings 26, 28, 30 in dielectric layer 14; applying a first electrical conductor 34 over dielectric layer 14 and contact pads 22, 24, 36; patterning first electrical conductor 34; applying a second dielectric layer 42 over first dielectric layer 14; patterning second dielectric layer 42 to selectively expose portions of the first electrical conductor; electroplating the exposed portions of first electrical conductor 34 to selectively form an electrical conducting path 16 (power coupling portion) having a thickness of at least 25 microns.

FIGS. 7-15 illustrate process stages in fabricating a power semiconductor module 200 in accordance with another embodiment wherein power coupling portion 16 is formed prior to control coupling portion 18.

Figure 7:
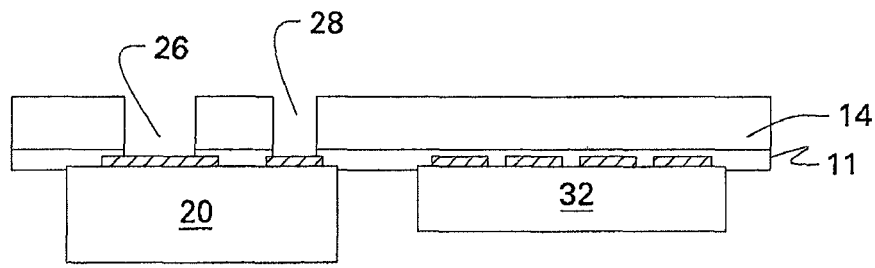
FIGS. 7-15 illustrate process stages in fabricating a power semiconductor module in accordance with another embodiment.
Figure 8:
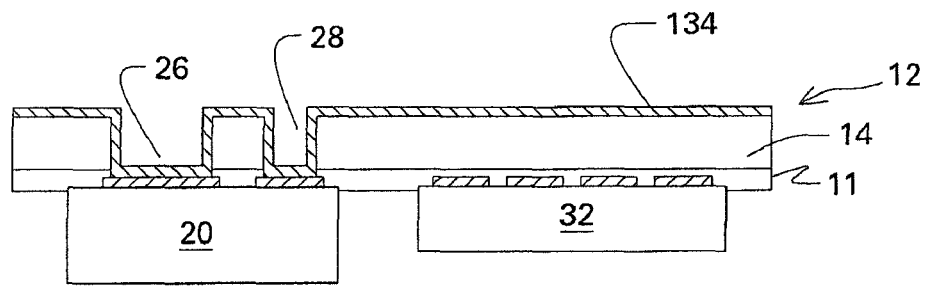

FIG. 7 illustrates an embodiment similar to that of FIG. 1 except that vias 26, 28 are only formed relative to power device 20, and FIG. 8 illustrates first layer 134 of electrical conductor 12. First layer 134 may be formed in a similar manner as discussed with respect to first layer 34 of FIG. 2 or, in another embodiment, may more simply comprise a seed layer of metallization.

Figure 9:
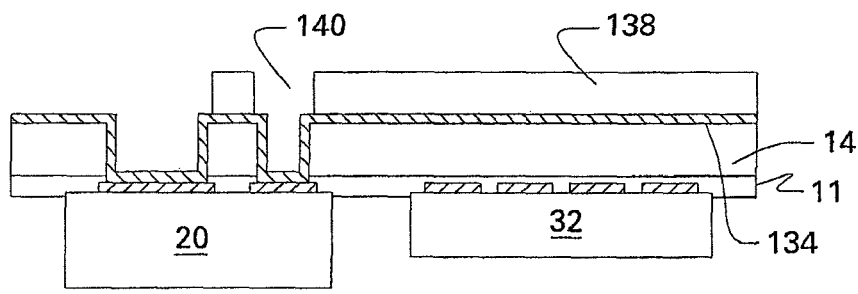
Figure 10:
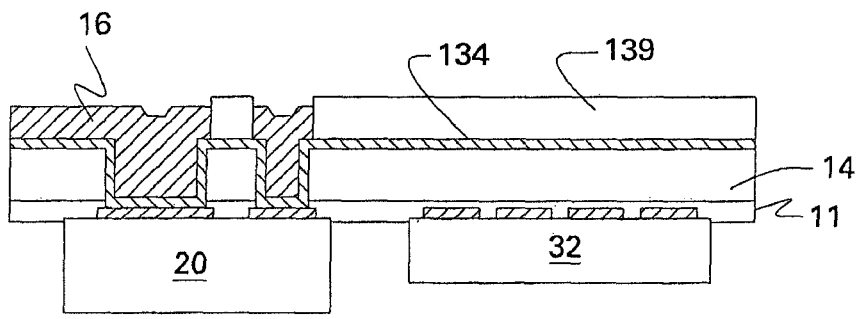

FIG. 9 illustrates a film photomask 138 applied to first layer 134, after being patterned to provide open areas 140 for electrical conductor plating, and FIG. 10 illustrates the module after the exposed portion of first layer 134 has been electroplated up to a higher thickness to form power coupling portion 16.

Figure 11:
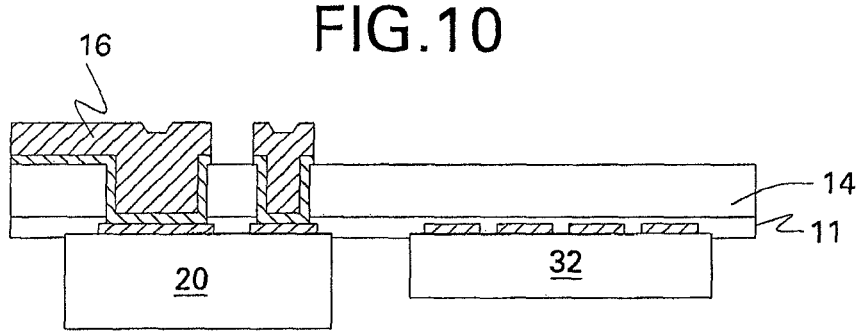

FIG. 11 illustrates removal of the photomask as well as the remaining portion of first layer 134 which was overlying dielectric layer 14. In one example, wet etching is used to for the removal. During this process, that exposed regions of the thick metal plated areas will also be partially etched. In an alternative embodiment that is not illustrated, undesired portions of first (seed) layer 134 may be patterned prior to application of film photomask 138.

Figure 12:
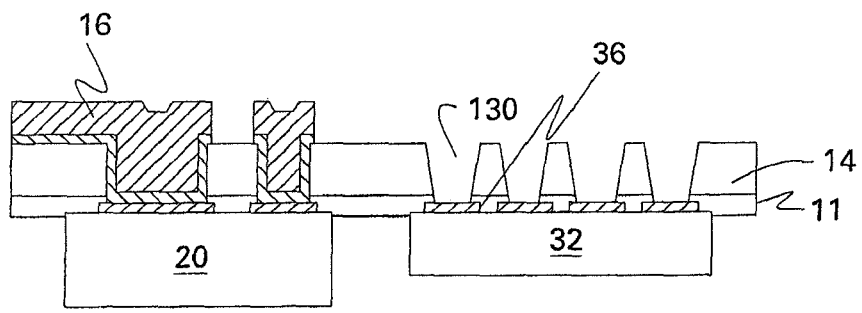

FIG. 12 illustrates vias 130 which are formed to expose control device contact pads 36. Such vias may be formed by any appropriate method such as laser ablation or etching, for example.

Figure 13:
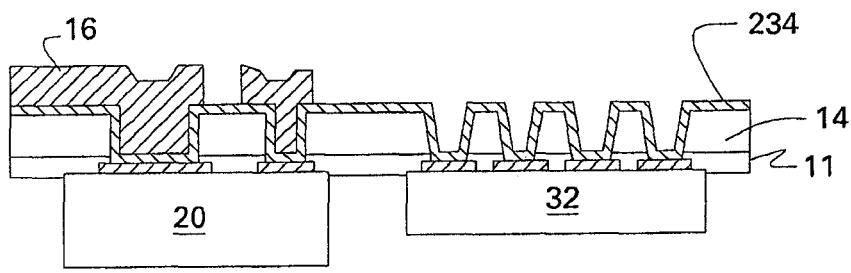

FIG. 13 illustrates the addition of second layer 234 of electrical conductor 12 (FIG. 15) which is applied over, dielectric layer 14, in vias 30, and contact pads 36. Second layer 234 may be applied in a similar manner as described with respect to layer 34 of FIG. 2, for example.

Figure 14:
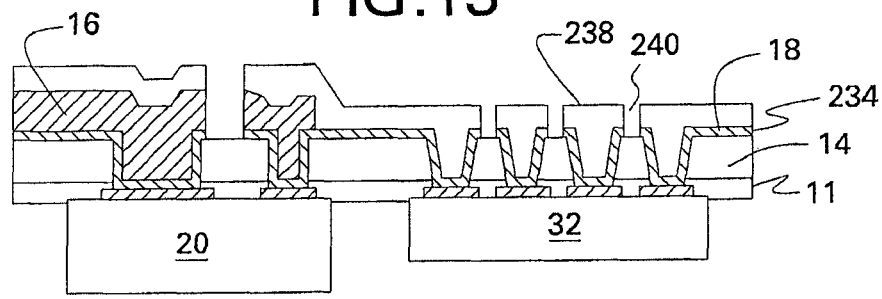

FIG. 14 illustrates a patterned photomask 238 which defines open areas 240 and through which portions of second layer 234 have been removed to form control coupling portion 18 of electric conductor 12. In one embodiment second layer 234 is etched through the openings.

Figure 15:
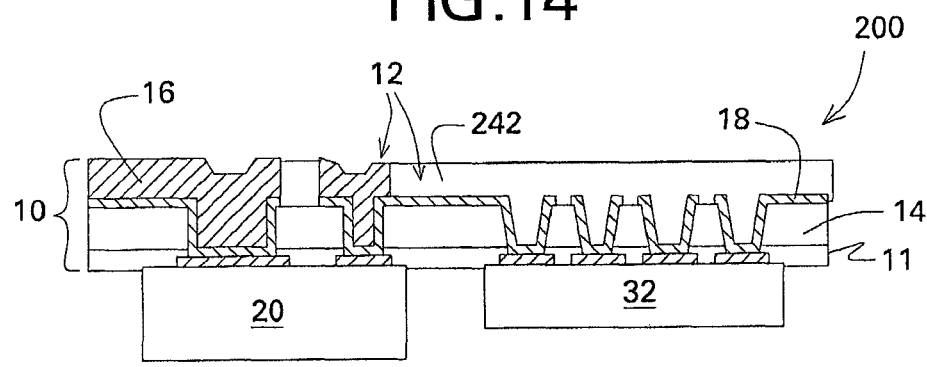

FIG. 15 illustrates an embodiment of module 200 wherein an additional dielectric layer 242 is provided over selected areas while leaving power coupling portion 16 of electrical conductor 12 exposed. Additional dielectric layer 242 is useful for providing some isolation over the control coupling portion 18 of electrical conductor 12. In one embodiment additional dielectric layer 242 comprises a photodefinable polymer such as a polyimide for example. In other embodiments, as for all dielectric layer embodiments described herein, materials of the type described with respect to dielectric layer 14 of FIG. 1 may be used.

Figure 16:
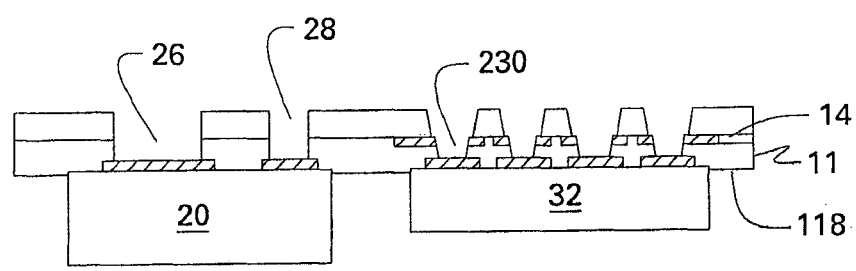
FIGS. 16-17 illustrate process stages in fabricating a power semiconductor module in accordance with another embodiment.
Figure 17:
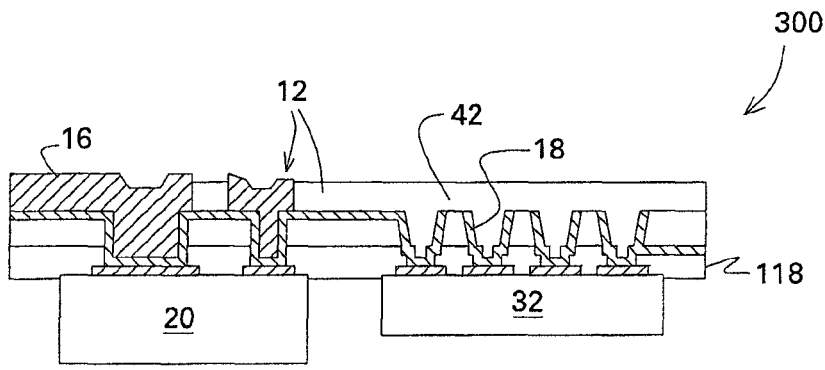

FIGS. 16-17 illustrate process stages in fabricating a power semiconductor module 300 in accordance with another embodiment wherein at least some 118 of control coupling portion 18 of electrical conductor 12 is situated on an opposing side of dielectric layer 14 as compared with power coupling portion 16 of electrical conductor 12. This embodiment is useful for providing additional interconnection flexibility.

FIG. 16 is similar to that of FIG. 1 except that some 118 of control coupling portion 18 is patterned on dielectric layer 14 prior to attachment of dielectric layer 14 to the underlying structure. Vias 230 are provided either after or before attachment.

FIG. 17 illustrates an embodiment of module 300 after power coupling portion 16, the remainder of control coupling portion 18 of electrical conductor 12, and additional dielectric layer 42 are formed on the structure of FIG. 16 in a similar manner as discussed with respect to FIGS. 2-6.

Figure 18:
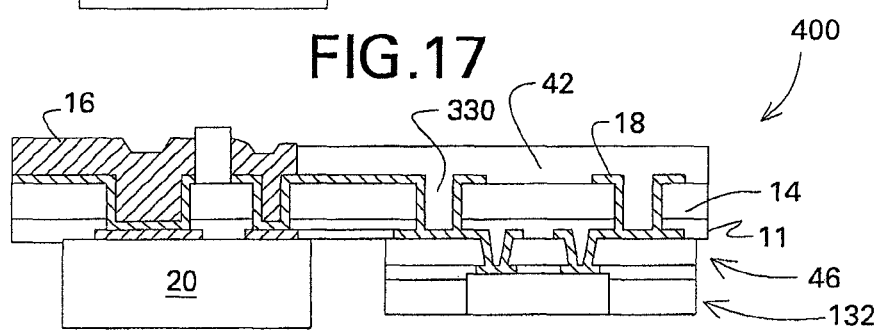
FIG. 18 is a sectional side view of a power semiconductor module in accordance with another embodiment.

FIG. 18 is a sectional side view of a power semiconductor module 400 in accordance with another embodiment wherein the control device comprises a packaged semiconductor element 132 which may optionally include its own package interconnect layer 46. Methods of forming such packages are described in Cole et al. U.S. Pat. No. 5,527,741, for example. In the example of FIG. 18, larger vias 330 are used, but this type of via is not required and a smaller via can alternatively be applied.

FIGS. 19-24 illustrate process stages in fabricating a power semiconductor module 500 in accordance with another embodiment wherein interconnect layer 10 comprises a plurality of interconnect layers 10, 110. In a more specific embodiment, least one of the interconnect layers comprises a control interconnect layer 10, at least another of the interconnect layers comprises a power interconnect layer 110 for interconnecting power device 20, and control interconnect layer 10 is closer to power device 20 than power interconnect layer 110.

Figure 19:
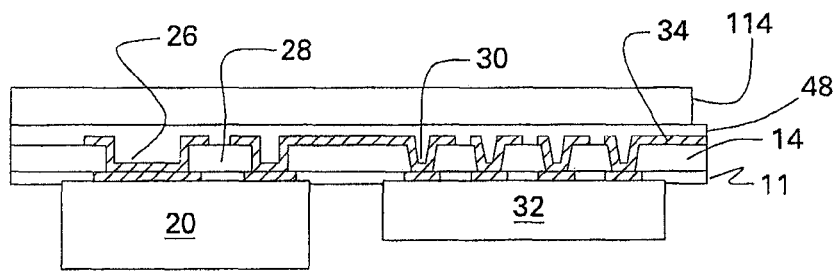
FIGS. 19-24 illustrate process stages in fabricating a power semiconductor module in accordance with another embodiment.

FIG. 19 is similar to that of FIG. 4 with the removal of the photomask and the addition of additional dielectric layer 114.

In one embodiment, additional dielectric layer 114 is laminated such that adhesive 48 fills the smaller vias 30 but not the larger vias 26 and 28.

Figure 20:
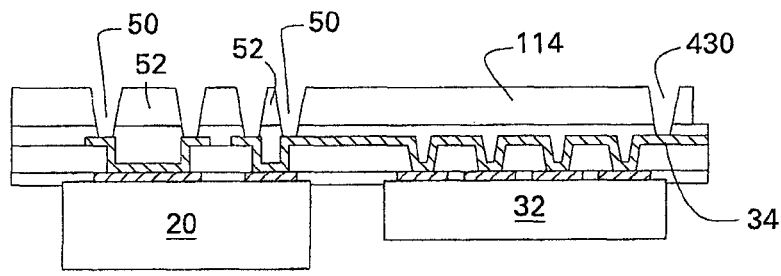
Figure 21:
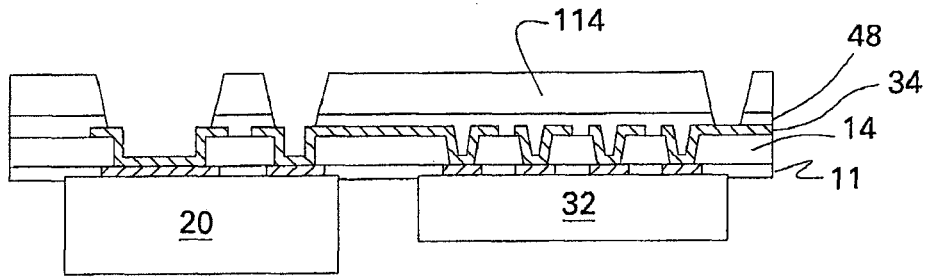

FIG. 20 illustrates a via 430 and perimeters 50 of larger vias, and FIG. 21 illustrates the assembly after removal of center plugs 52 from within perimeters 50. In one example the vias and perimeters are formed by laser ablation. Plugs 52 may be removed by any appropriate process with several examples including scrubbing, rinsing, water spraying, high-pressure air spraying, or vacuum picking-up and an another example including the protective film embodiment described with respect to FIGS. 30 and 31.

Figure 22:
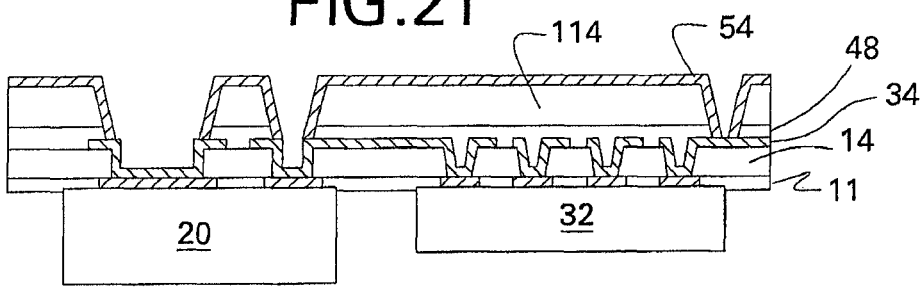
Figure 23:
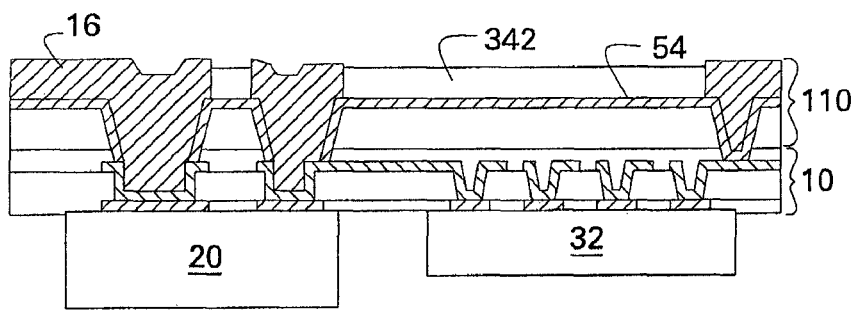

FIG. 22 illustrates the addition of a seed conductive layer 54, and FIG. 23 illustrates an additional dielectric layer 342 having openings through which power coupling portion 16 is formed.

Figure 24:
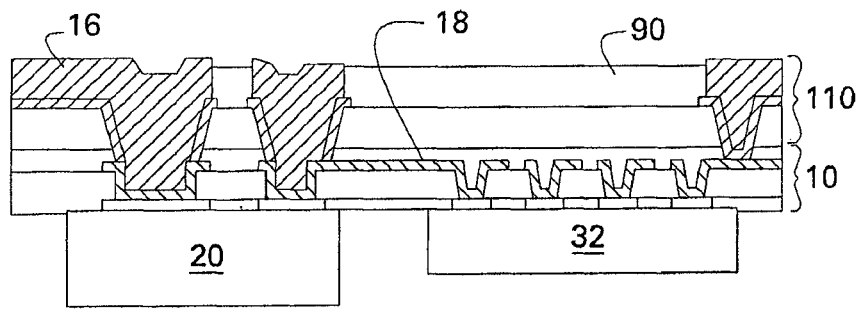

FIG. 24 illustrates an embodiment of the power semiconductor 500 after removal of additional dielectric layer 342 and the extra portion of seed layer 54 and after addition of a passivation layer 90 patterned to cover the module except for selected exposed regions. In one embodiment, passivation layer 90 comprises a photodefinable polymer layer, such as a photodefinable solder mask or polyimide, or a non-photodefinable polymer that is selectively applied such as by stencil, spray, or dry film processing. In another embodiment passivation layer 90 comprises an inorganic coating such as an oxide, nitride or amorphous layer.

FIGS. 25-28 illustrate process stages in fabricating a power semiconductor module 600 in accordance with another embodiment wherein interconnect layer 10 comprises a plurality of interconnect layers 10, 110 formed by different process steps than those shown in FIGS. 19-24.

Figure 25:
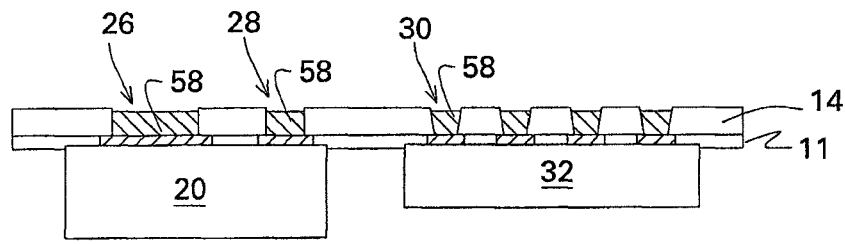
FIGS. 25-28 illustrate process stages in fabricating a power semiconductor module in accordance with another embodiment.

The embodiment of FIG. 25 is similar to the embodiment of FIG. 1 with the addition of electrically conductive material 58 in vias 26, 28, 30. In one example, electrically conductive material 58 is formed by electroless plating of the power device and control device contact pads 22, 24, 36.

Figure 26:
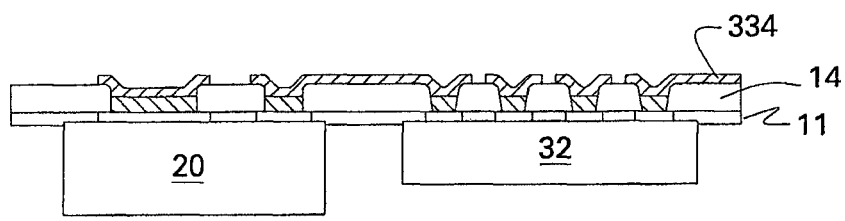
Figure 27:
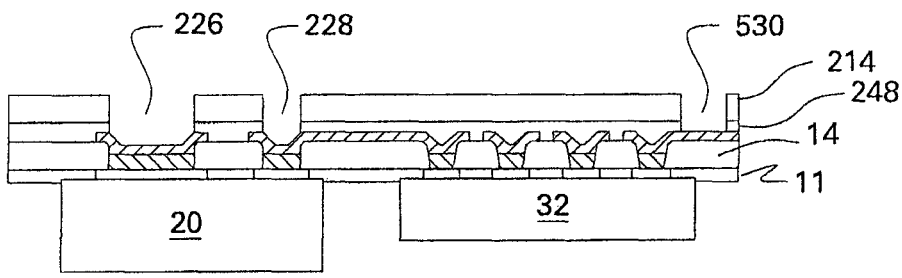
Figure 28:
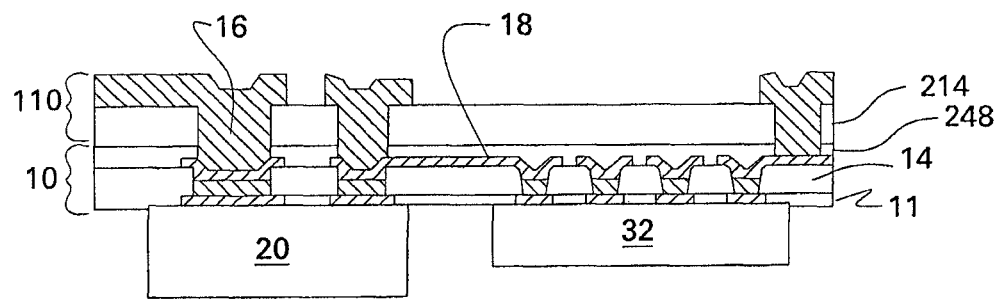

FIG. 26 illustrates the addition of a patterned electrically conductive layer 334 overlying dielectric layer 14 and electrically conductive material 58; FIG. 27 illustrates additional dielectric layer 114 including via openings 226, 228, 530; and FIG. 28 illustrates electrically conductive material in the via openings which forms power coupling portion 16 of electrical conductor 12.

FIGS. 29-45 illustrate process stages in fabricating a power semiconductor module 700 in accordance with another embodiment wherein the semiconductor power device comprises a plurality of semiconductor power devices 120, 220 and wherein control coupling portion 218 is coupled to at least one control pad of at least one of the plurality of semiconductor power devices.

Figure 29:
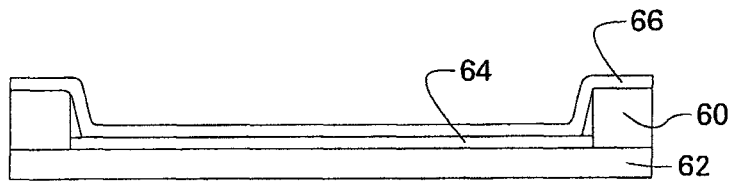
FIGS. 29-45 illustrate process stages in fabricating a power semiconductor module in accordance with another embodiment.

FIG. 29 illustrates a frame 60 having a dielectric film 62 attached thereto, an adhesive 64 overlying film 62, and a protective layer 66 overlying adhesive 64. Frame 60 may comprise any structurally suitable material and, in one example, comprises stainless steel. Dielectric film 62 may comprise any dielectric material that, when combined with the frame, is suitable to provide dimensional stability. In one example, dielectric film 62 comprises a polyimide material having a thickness of at least 50 micrometers. Other examples of dielectric materials such as described above with respect to dielectric layer 14 may alternatively be used.

In one embodiment, dielectric film 62 is prepared for the addition of adhesive 64 by reactive ion etching, an adhesive promoter (not shown) such as a siloxane based adhesion promoter, for example, is applied and baked, and an adhesive material is spun coated to a thickness of eighteen micrometers and partially cured.

Figure 30:
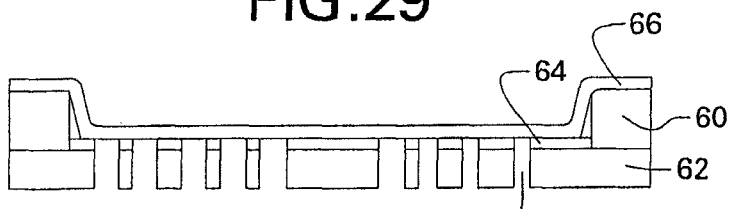

Protective layer 66 may comprise a material such as KAPTON™ polyimide (KAPTON is a trademark of Dupont Company), for example and may be selected to comprise a material that does not laser ablate within the same wavelength range as dielectric film 62 and adhesive 64. FIG. 30 illustrates vias 68 formed within dielectric film 62 and adhesive 64 which may be formed by any suitable technique. These vias typically do not extend completely through protective layer 66. In one embodiment, the depth of vias 68 is controlled by the number and power of laser ablation pulses.

Figure 31:
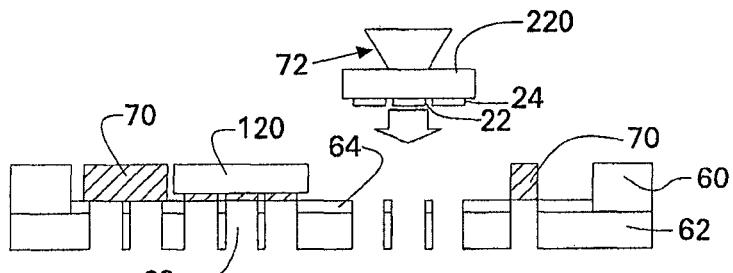

FIG. 31 illustrates the assembly after the removal of protective layer 66 and during addition of power semiconductor devices 120 and 220. Protective layer 66 may be removed by peeling, for example. If any large vias are desired, in one embodiment wherein laser ablation is used, the laser is used to etch a perimeter of a via to create a via "plug" which is then removed as protective layer 66 is peeled. Protective layer 66 is useful for allowing plugs (such as shown in FIG. 20 by reference number 52) to be removed along with the protective film. Protective layer 66 also provides protection to the regions around the ablated area from particulate contamination during the laser ablation step described with respect to FIG. 30.

Figure 44:
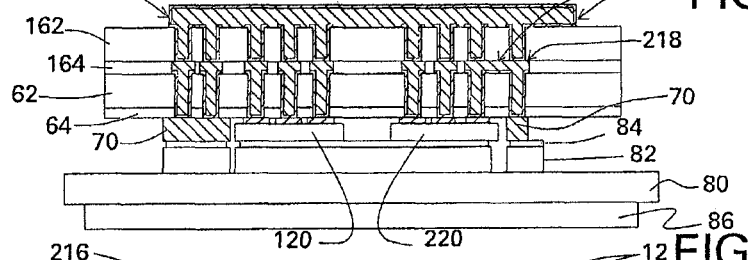
Figure 45:
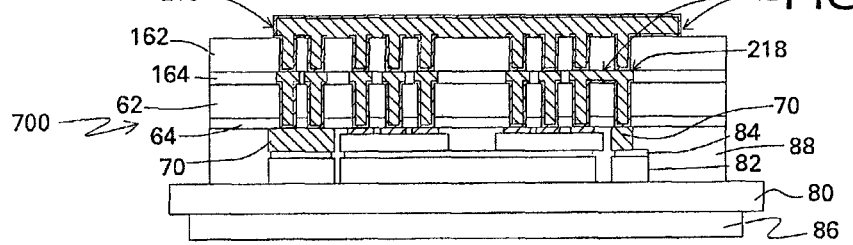

Also illustrated in FIG. 31 are shims 70 which are not required but can be useful for routing control and power connections (such as emitter or gate connections, for example) to substrate metallization (shown in FIGS. 44 and 45). Shims 70 typically comprise a metal such as copper, for example. Power devices 120, 220 and shims 70 may be attached by any selected means and in one example are attached by a placement tool 72 such as a vision driven pick and place assembly. The positions are selected to align with vias 68. If the above-described process of partially curing of adhesive 64 is used, power devices 120, 220 and shims 70 may then be attached to dielectric film 62 by further curing adhesive 64.

Figure 32:
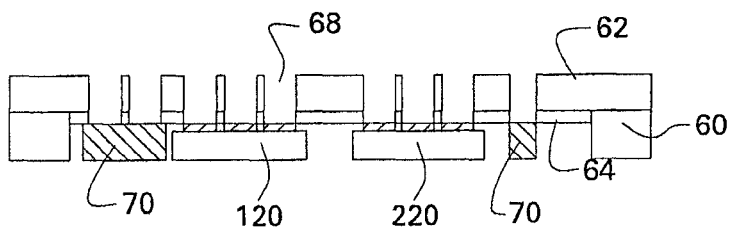

FIG. 32 illustrates the assembly in an orientation with dielectric film 62 facing upwards. Although the above embodiments have illustrated an approach of forming vias before power device attachment (which provides convenient flexibility in using perimeters for larger vias), in an alternative approach, vias may be fabricated after attachment of the power devices. In either approach, it is useful to use a reactive ion etching process to remove any dirt and to facilitate adhesion.

Figure 33:
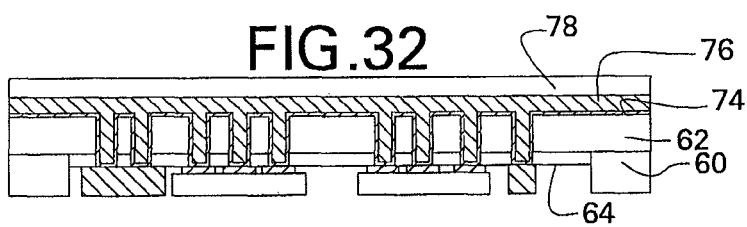

FIG. 33 illustrates the assembly after the addition of electrically conductive adhesion layer 74, electrical conductor 76, and photoresist 78. In one embodiment, adhesion layer 74 comprises titanium sputtered to a thickness of 0.1 micrometers coated by copper sputtered to a thickness of 0.3 micrometers, and electrical conductor 76 is coated by copper electroplated to a thickness of 40 micrometers.

Figure 34:
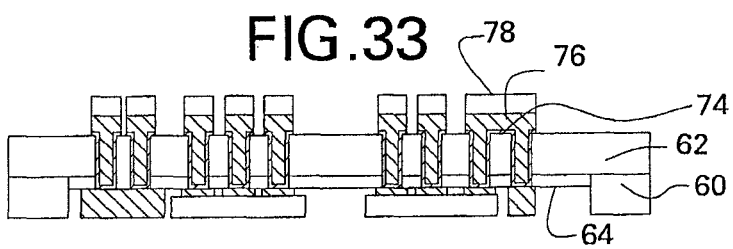
Figure 35:
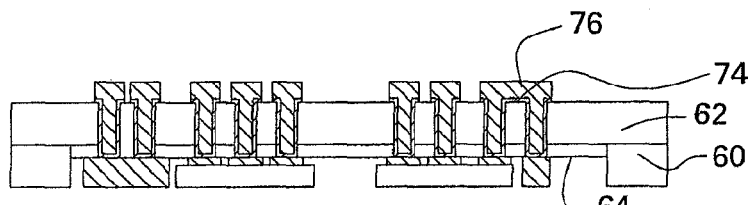

FIG. 34 illustrates the assembly after photoresist 78 has been patterned and electrical conductor 76 and adhesion layer 74 have been etched therethrough. In one embodiment, etching is accomplished with ferric chloride (FeCl) for example. The photoresist is then stripped to provide the structure shown in FIG. 35. FIGS. 34 and 35 illustrate an embodiment generally known as subtractive patterning wherein the process is applying thick metal over the entire surface and then etching selected regions. The metallization process depicted in FIGS. 8-11, whereby a seed metal is applied to the entire surface, a photomask material is applied and patterned, and a thick metal is selectively plated up in the regions where the mask material has been removed, is generally known by those skilled in the art as a semi-additive metal patterning process. Although FIGS. 8-11 depict the semi-additive process and FIGS. 32-35 depict the subtractive process, it is understood that any of the figures depicted here could utilize either the semi-additive process or the subtractive process based upon processing preferences and equipment capabilities.

Figure 36:
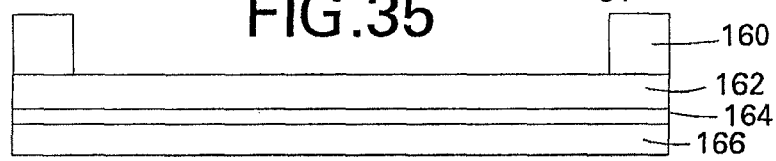
Figure 37:
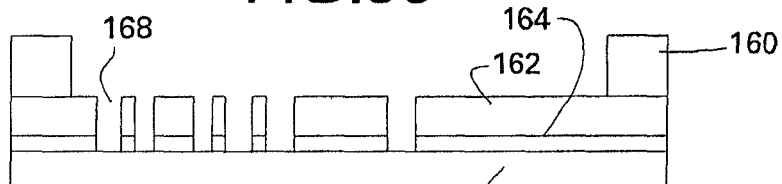
Figure 38:
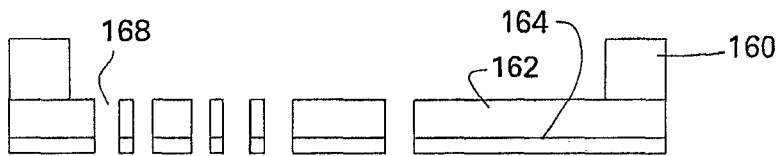

FIG. 36 is similar to FIG. 29 and illustrates a second frame 160 having a second dielectric film 162 attached thereto, an adhesive 164 adjacent film 162, and a protective layer 166 adjacent adhesive 164. These elements may optionally comprise similar materials to the corresponding elements discussed above. A difference with the embodiment of FIG. 36 as compared with the embodiment to FIG. 29 is that adhesive 164 of FIG. 36 is on an opposite side of the frame than adhesive 64 of FIG. 29. In a similar manner as discussed above with respect to FIGS. 30 and 31, as shown in FIG. 37, vias 168 may be formed, and, as shown in FIG. 38, protective layer 166 is removed.

Figure 39:
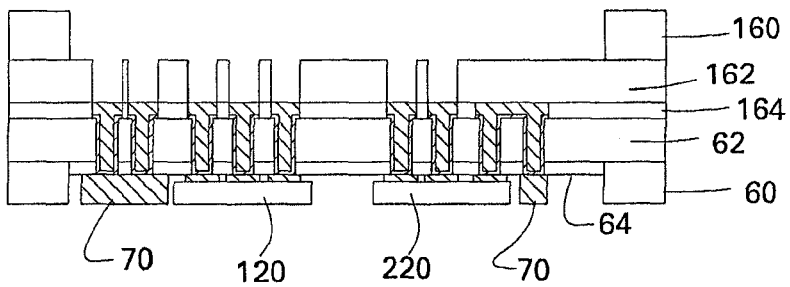
Figure 40:
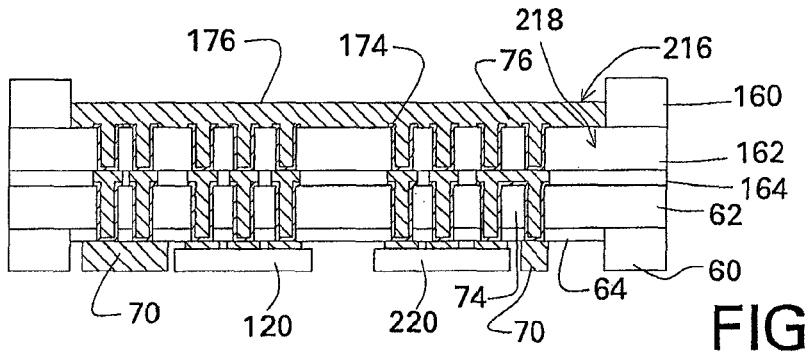

FIG. 39 illustrates the assembly after frames 60 and 160 have been aligned. If desired, the frames may be fabricated with features or pins to facilitate alignment. In one embodiment, dielectric film 162 is laminated to dielectric film 62 by applying pressure. Adhesive 164 is cured, and the assembly is prepared for addition of a second electrical conductor 176, as shown in FIG. 40, which again may be facilitated with an electrically conductive adhesion layer 174. In one embodiment, second electrical conductor 176 is formed to have a thickness greater than that of electrical conductor 76 which in a further example is in a range of 2 mils (50.8 micrometers) to 5 mils (127 micrometers). In such embodiments second electrical conductor 176 forms a power coupling portion 216 and electrical conductor 76 forms a control coupling portion 218 of the module.

Figure 41:
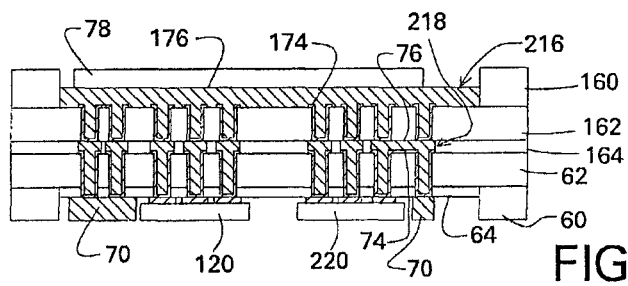
Figure 42:
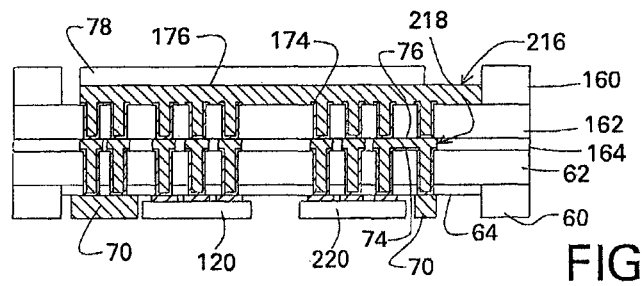
Figure 43:
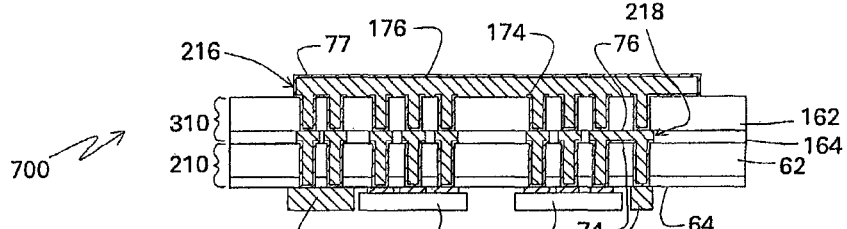

FIG. 41 illustrates application of a photoresist 78, FIG. 42 illustrates power coupling portion 216 of the electrical conductor after patterning, and FIG. 43 illustrates the resulting module after singulation. In one embodiment, after removal of photoresist 78, outer metallization 77 is deposited with a material such as electroless nickel, gold, or combinations thereof. The result is a first interconnect layer 210 comprising first dielectric film 62 and control coupling portion 218 and a second interconnect layer 310 comprising second dielectric film 162 and power coupling portion 216. The optional singulation may be performed in any appropriate manner with one exampling being laser etching.

In one combination of the above embodiments, a fabrication method comprises: providing an adhesive-coated first dielectric layer 62 having a plurality of first vias 68 extending therethrough; mounting semiconductor devices 120, 220 while aligning contact pads 22, 24 of the semiconductor devices with the first vias; applying first metallization 76 on the first dielectric layer, the first vias, and at least portions of the contact pads; patterning the first metallization; providing an adhesive-coated second dielectric layer 162 having a plurality of second vias 268 extending therethrough, some of the second vias in the second dielectric layer corresponding to some of the first vias in the first dielectric layer; laminating the adhesive-coated surface of the second dielectric layer to the first dielectric layer; applying second metallization 176 on the second dielectric layer, the second vias, and the first metallization to a combined thickness of at least twenty five microns; and patterning the second metallization. In a more specific embodiment, some of the semiconductor devices comprise power devices and others of the semiconductor devices comprise control devices and at least some of the power device contact pads are coupled to metallization in respective first vias.

FIG. 44 illustrates attachment of module 700 to an underlying substrate 80 including substrate pads 82. Substrate 80 may comprise any structurally appropriate material and in one embodiment comprises an inorganic dielectric with high thermal conductivity (greater than or equal to 50 W/mK for example), high dielectric strength (greater than or equal to 100 kV/mm for example), and low coefficient of thermal expansion (in a range of two ppm/C to ten ppm/C for example) such as silicon carbide, silicon nitride, aluminum nitride, boron nitride, alumina, beryllium oxide, or ceramic materials, for example. Substrate pads 82 comprise an electrically conductive material with one example being copper. In one embodiment, solder 84 is used to couple semiconductor power devices 120 and 220 and shims 70 to substrate pads 82. A structural balancing conductive layer (which, in one embodiment, is a part of an integral heat exchanger) 86 may further be coupled to substrate 80. FIG. 45 illustrates the module after application of an encapsulating material 88 around the semiconductor power devices and the substrate pads. In one example encapsulating material 88 comprises a filled epoxy or a low viscosity capillary underfill material.

A power semiconductor device may comprise a discrete device (such as a singulated device), a tile comprising a plurality of elements (sometimes referred to as cells), a wafer level device comprising a plurality of elements, or combinations thereof. Tiles or wafer level devices are sometimes simpler to position or align on the module. Furthermore, if such tiles or wafers are tested in advance of formation of the vias (such that the semiconductor power devices comprise known good die elements as described in commonly assigned Wojnarowski U.S. Pat. No. 5,672,546), the via and electrical conductor interconnections can be adapted so that known good die elements are used and known bad elements are isolated.

Figure 46:
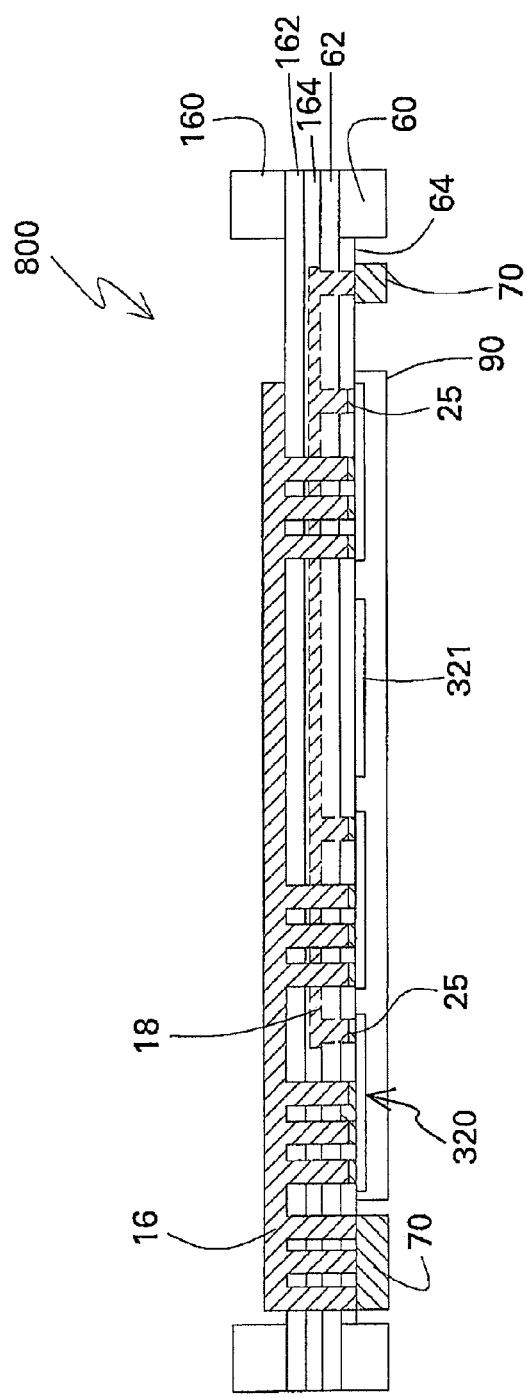
FIG. 46 is a sectional side view of a power semiconductor module in accordance with another embodiment.

FIG. 46 is a sectional side view of a power semiconductor module 800 in accordance with an embodiment wherein a wafer 90 level element 320 is used. FIG. 46 additionally illustrates control coupling portion 18 being situated on a different sectional slice of the module than power coupling portion 16 as well as a known "bad" die elements 321 which is not coupled with an electrical conductor. FIG. 46 further illustrates an embodiment wherein power elements 320 comprise MOSFETS and gate connections 25 are routed to the edge of the module via portion 18 without causing disruption in the source connections of the module.

Figure 47:
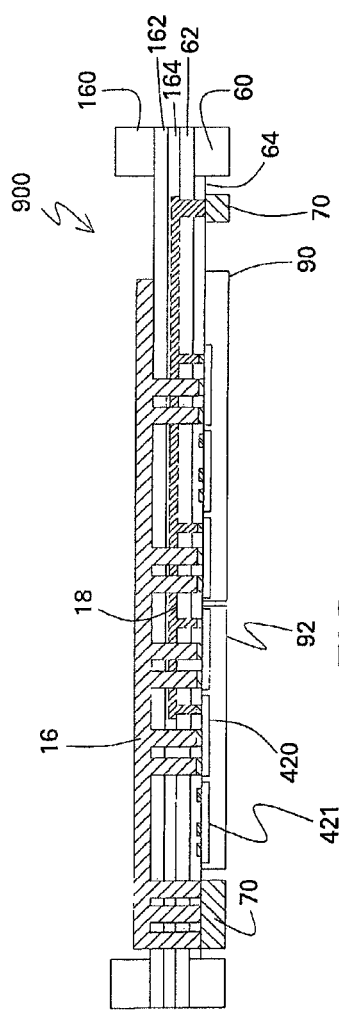
FIG. 47 is a sectional side view of a power semiconductor module in accordance with another embodiment.
Figure 48:
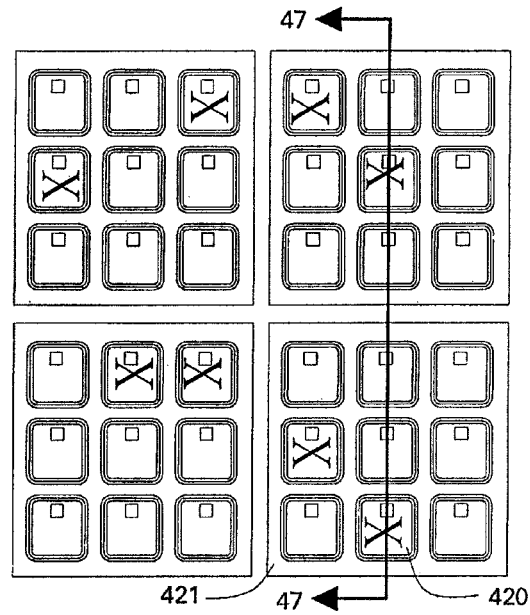
FIG. 48 is a top view of the embodiment of FIG. 47.

FIG. 47 is a sectional side view of a power semiconductor module 900 in accordance with another embodiment wherein tiled level elements 420 are used and known bad die elements 421 are not used. FIG. 48 is a partial top view of the tiles 92 of FIG. 47.

FIGS. 49 and 50 are sectional side view of a power semiconductor module 1000 in accordance with another embodiment wherein semiconductor power device 520 comprises an IGBT, semiconductor power device 620 comprises a diode, and a power control device 232 is mounted on an opposite side of dielectric films 162 and 62 than semiconductor power devices 520 and 620. In the example of FIG. 50, solder 94 is used to couple control device 232 to the module, and solder 84 is used for coupling to substrate pads 82 of substrate 80. In one embodiment, as shown, power coupling portion 16 of electrical conductor 12 is configured to couple at least some of the semiconductor power devices in parallel. In an alternative embodiment, at least some semiconductor power devices are coupled in series.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for fabricating a power semiconductor module comprising:
providing an adhesive coated first dielectric layer having a plurality of first vias extending therethrough;
mounting semiconductor devices while aligning contact pads of the semiconductor devices with the first vias;
applying first metallization on the first dielectric layer, the first vias, and at least portions of the contact pads;
patterning the first metallization;
providing an adhesive coated second dielectric layer having a plurality of second vias extending therethrough, some of the second vias in the second dielectric layer corresponding to some of the first vias in the first dielectric layer;
laminating the adhesive-coated surface of the second dielectric layer to the first dielectric layer;
applying second metallization on the second dielectric layer, the second vias, and the first metallization to a combined thickness of at least twenty five microns; and
patterning the second metallization.

2. The method of claim 1 wherein some of the semiconductor devices comprise power devices and others of the semiconductor devices comprise control devices.

3. The method of claim 2 wherein the at least some of the power device pads are coupled to respective portions of the first metallization in respective first vias.

4. A method for fabricating a power semiconductor module comprising:
providing a first dielectric layer, a power semiconductor device, and a control device with the power semiconductor device and control device having contact pads aligned with via openings in the dielectric layer;
applying a first electrical conductor over the dielectric layer and contact pads;
patterning the first electrical conductor;
applying a second dielectric layer over the first dielectric layer;
patterning the second dielectric layer to selectively expose portions of the first electrical conductor;
applying a second electrical conductor over selected portions of the second dielectric layer and the exposed portions of the first electrical conductor to selectively form an electrical conducting path having a thickness of at least ten micrometers.

\* \* \* \* \*